(12) United States Patent
Pasotti et al.

(10) Patent No.: US 6,323,799 B1
(45) Date of Patent: Nov. 27, 2001

(54) DEVICE FOR READING NON-VOLATILE MEMORY CELLS IN PARTICULAR ANALOG FLASH MEMORY CELLS

(75) Inventors: Marco Pasotti, S. Martino Siccomario; Roberto Canegallo, Tortona; Giovanni Guaitini, Trecella; Pier Luigi Rolandi, Monleale, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/421,616

(22) Filed: Oct. 19, 1999

(30) Foreign Application Priority Data

Oct. 20, 1998 (EP) .................................................. 98830626

(51) Int. Cl.⁷ ..................................................... H03M 1/12

(52) U.S. Cl. ........................................... 341/156; 341/155

(58) Field of Search .................................... 341/155, 118, 341/120, 156

(56) References Cited

U.S. PATENT DOCUMENTS

| | | | |
|---|---|---|---|
| 3,877,023 | * 4/1975 | Spicer et al. | 341/144 |
| 4,559,523 | * 12/1985 | Wakita | 341/155 |
| 4,973,974 | 11/1990 | Suzuki | 341/118 |
| 5,055,845 | * 10/1991 | Ridkosil | 341/155 |
| 5,105,194 | 4/1992 | Mizunoue | 341/156 |
| 5,231,398 | * 7/1993 | Topper | 341/156 |
| 5,515,046 | * 5/1996 | Mandl | 341/143 |
| 5,592,164 | * 1/1997 | Hilbert et al. | 341/120 |
| 5,745,409 | 4/1998 | Wong et al. | 365/185.03 |
| 6,169,503 | * 1/2001 | Wong | 341/136 |

OTHER PUBLICATIONS

Suh et al., "TA 7.5: A 3.3V 32Mb NAND Flash Memory with Incremental Step Pulse Programming Scheme," *IEEE International Solid–State Circuits Conference*, pp. 128–129, 1995.
Bauer et al., "TA 7.7: A Multilevel–Cell 32Mb Flash Memory," *IEEE International Solid–State Circuits Conference*, pp. 132–133, 1995.
Cho and Gray, "A 10 b, 20 Msample/s, 35 mW Pipeline A/D Converter," *IEEE Journal of Solid–State Circuits*, 30(3):166–172, 1995.
Van Tran et al., "FP 16.6: A 2.5V 256–Level Non–Volatile Analog Storage Device Using EEPROM Technology," *IEEE International Solid–State Circuits Conference*, pp. 270–271, 1996.
Rolandi et al., "SA 21.2: 1M–Cell 6b/Cell Analog Flash Memory for Digital Storage," *IEEE International Solid–State Circuits Conference*, pp. 334–335, 1998.

* cited by examiner

*Primary Examiner*—Peguy JeanPierre
*Assistant Examiner*—Jean Bruner Jeanglaude
(74) *Attorney, Agent, or Firm*—E. Russell Tarleton; Seed IP Law Group, PLLC

(57) ABSTRACT

A reading device having an A/D converter of n+m bits receiving an input signal correlated to the threshold voltage of the memory cell, and supplying a binary output word of n+m bits. The A/D converter is of a double conversion stage type, wherein a first A/D conversion stage carries out a first analog/digital conversion of the input signal to supply at the output a first intermediate binary word of n bits, and the second A/D conversion stage can be activated selectively to carry out a second analog/digital conversion of a difference signal correlated to the difference between the input signal and the value of the first intermediate binary word. The second A/D conversion stage generates at the output a second intermediate binary word of m bits that is supplied along with the first intermediate binary word to an adder, which generates the binary output word of n+m bits.

16 Claims, 1 Drawing Sheet

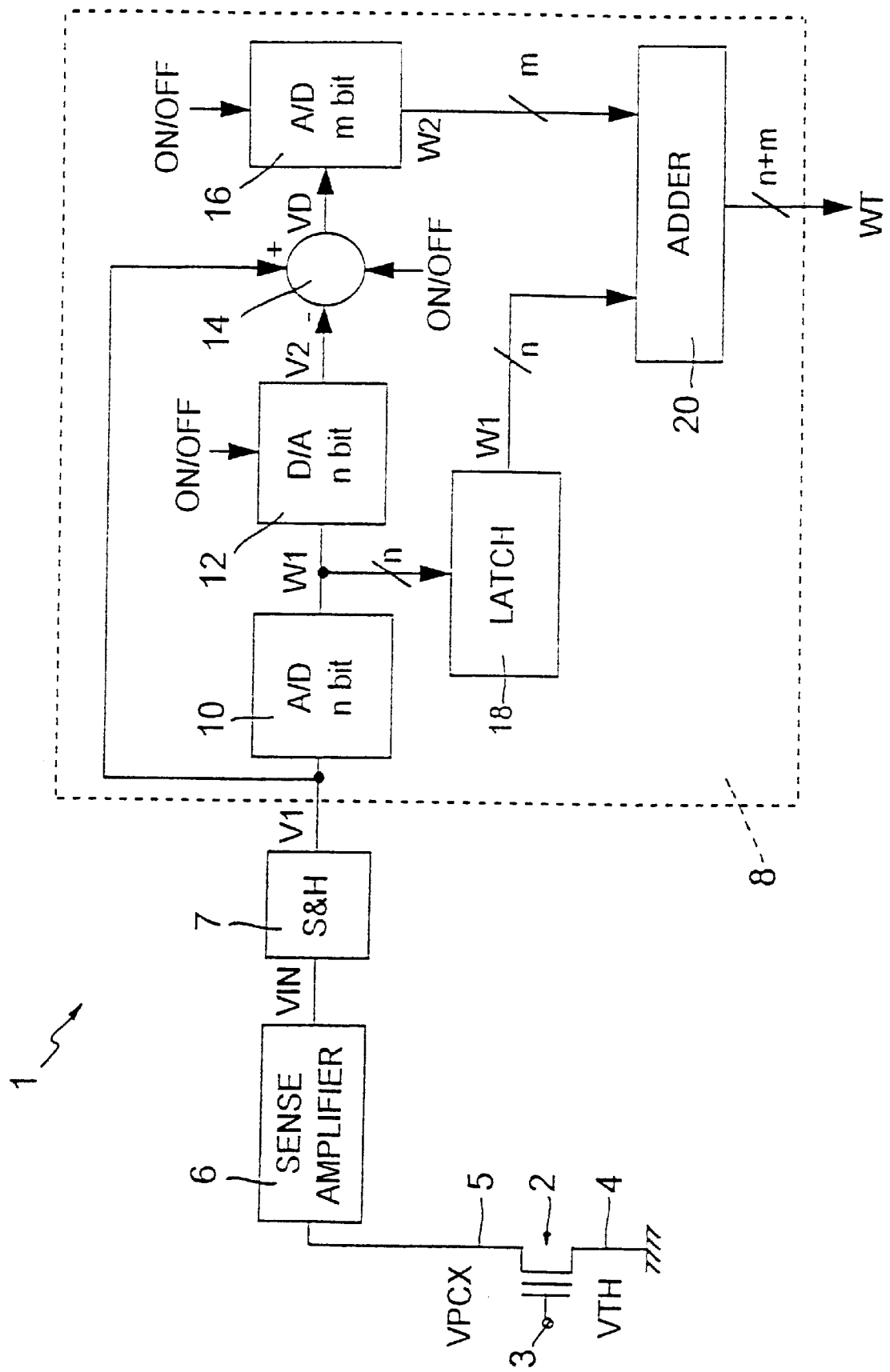

DEVICE FOR READING NON-VOLATILE MEMORY CELLS IN PARTICULAR ANALOG FLASH MEMORY CELLS

TECHNICAL FIELD

The present invention relates to a device for reading non-volatile memory cells, and in particular analog flash memory cells.

BACKGROUND OF THE INVENTION

As known, in non-volatile, floating gate memory cells, writing a cell modifies the quantity of electric charges stored in the floating gate region of the cell, thus programming the cell threshold voltage according to analog or digital values to be stored.

Analog non-volatile memory cells are typically read through a reading device formed by an analog/digital (A/D) converter. Such A/D converters have a plurality of comparator circuits, each receiving at a first input a voltage correlated to the value of the current flowing in the read memory cell, and thus to the value of the cell threshold voltage, and at a second input a reference voltage having a predetermined reference value. The comparator circuits then generate at the output respective digital signals, each of which has a high or low logic state indicative of the outcome of the comparison. The comparator circuit output signals are then supplied to a decoding circuit that, according to the logic state of the output signals of the comparator circuits, generates at the output a binary word associated with the threshold voltage of the read memory cell.

It is also known that during programming, the memory cell is verified to ensure that the required datum is stored. Verifying of a memory cell must be carried out with much greater accuracy than during normal reading of the cell ensure long term legibility of the cell and correctness of the stored datum.

Thus, during program and verify, it is typically necessary to generate binary words correlated to the threshold voltage of the read memory cells and have a bit number larger than that required during normal reading operations. Consequently, the circuit architecture of reading devices of the above-described type, comprising $2^n-1$ comparator circuits for binary words of n bits, makes it difficult to use a single reading device both for verify and memory cell reading.

SUMMARY OF THE INVENTION

The invention provides a device for reading non-volatile memory cells, which can be used equally well both in verify and in reading operations.

BRIEF DESCRIPTION OF THE DRAWINGS

FIG. 1 is a block diagram of a reading device for non-volatile memory cells.

DETAILED DESCRIPTION OF THE INVENTION

For an understanding of the present invention, a representative embodiment is described, purely by way of non-limiting example, with reference to the sole attached figure, which shows the simplified circuit diagram of a reading device according to the present invention.

In FIG. 1 a reading device 1 of a memory cell 2 is shown in block representation. In particular, memory cell 2 has a gate terminal 3 receiving a reading voltage VPCX, a source terminal 4 connected to ground, and a drain terminal 5 connected to the input of the reading device 1. The reading device 1 provides at the output a binary output word WT of n+m bits, correlated to the threshold voltage VTH of memory cell 2, wherein n and m have the meaning apparent hereinafter.

Reading device 1 comprises a detection or "sense amplifier" circuit 6, a sample and hold circuit, hereinafter indicated as S/H circuit 7, and an A/D (analog/digital) converter 8, of n+m bits.

Sense amplifier circuit 6 has an input connected to the drain terminal 5 of the memory cell 2, and an output supplying an input voltage VIN, the amplitude of which is correlated to the value of the current flowing in memory cell 2 during reading and thus correlated to the threshold voltage VTH of memory cell 2. Sense amplifier circuit 6 is of a known type, and is for example described in patent application EP-A-833348 in the name of the applicant.

S/H circuit 7, of known type, has an input connected to the output of sense amplifier circuit 6, supplying input voltage VIN, and an output supplying a first voltage signal V1 of constant value, equivalent to the value of the input voltage VIN at the sampling instant.

A/D converter 8 has an input connected to S/H circuit 7 supplying the first signal V1, and an output supplying the binary output word WT.

A/D converter 8 is of the double conversion stage type, to carry out a first, approximate conversion determining n bits of the binary output word WT, and typically the most significant n bits, and a second, more accurate conversion, determining the remaining m bits of the binary output word, typically the least significant m bits.

In particular, AID converter 8 comprises a first A/D conversion stage 10 of n bits; a D/A conversion stage 12 of n bits; a differentiator stage 14; a second A/D conversion stage 16 of m bits; a storage stage 18; and an adder stage 20.

The first A/D conversion stage 10, which carries out the approximate conversion, has an input connected to the output of S/H circuit 7 and receiving therefrom the first signal V1, and an output supplying a first intermediate binary word W1 of n bits. D/A conversion stage 12 has an input connected to the output of the first A/D conversion stage 10 and receiving therefrom the first intermediate binary word W1, and an output supplying a second voltage signal V2. The differentiator stage 14 has a first input connected to the output of S/H circuit 7 and receiving therefrom the first signal V1, a second input connected to the output of D/A conversion stage 12 and receiving therefrom the second signal V2, and an output supplying a difference signal VD, correlated to the difference between the first and the second signal V1, V2.

The second A/D conversion stage 16, which carries out the accurate conversion, has an input connected to the output of the differentiator stage 14 and receiving therefrom the difference signal VD, and an output supplying a second intermediate binary word W2 of m bits. The storage stage 18 (formed by a latch) has an input connected to the output of the first A/D conversion stage 10, and an output connected to a first input of the adder stage 20 receiving therefrom the first intermediate binary word W1. The adder stage 20 also has a second input connected to the output of the second A/D conversion stage 16 and receiving therefrom the second intermediate binary word W2, and an output supplying the binary output word WT of n+m bits, equivalent to the sum of the first and the second intermediate binary words W1, W2.

D/A conversion stage 12, second A/D conversion stage 16, and differentiator stage 14 also have a further input, receiving, for example from a control stage not shown, an enabling/disabling ON/OFF signal, to command switching on and off these stages.

In particular, during reading of memory cell 2, the enabling/disabling ON/OFF signal has a first logic value such as to control switching off D/A conversion stage 12, second A/D conversion stage 16, and differentiator stage 14. Consequently, the reading device 1 acts as an analog/digital converter of n bits, and thus supplies the binary output word WT of n+m bits, wherein n bits, for example the most significant ones, are correlated to the threshold voltage of memory cell 2, whereas the remaining m bits, in the present example the least significant bits, are not considered.

On the other hand, during verifying, enabling/disabling ON/OFF signal has a second logic level such as to control switching on of stages 12, 14, 16; consequently, reading device 1 acts as an analog/digital converter of n+m bits, and supplies the binary output word WT of n+m bits, indicative of the threshold voltage of memory cell 2, with greater accuracy than that obtained during normal reading operations.

Conveniently, the condition m=n may be applied, and thus during verify, reading has twice the accuracy than during normal reading operations.

The operation of reading device 1 is now described briefly with reference only to when stages 12, 14 and 16 are switched on, since where these stages are switched off, operation of reading device 1 is reduced to that of an analog/digital converter of n bits.

When all stages 6–20 of reading device 1 are switched on, reading device 1 carries out a first conversion of n bits of the first signal V1 (quantization of first signal V1 with respect to 2" intervals), and a second conversion of m bits of difference signal VD, which is the difference between first signal V1 and second signal V2, which has a value indicative of the quantization of first signal V1, carried out in the first conversion.

Difference signal VD thus represents the difference between the analog value of the first signal V1 and the quantized value of the same first signal V1, and thus allows the second intermediate binary word W2 to be obtained, which, when combined with the first intermediate binary word W1, supplies the output word WT, of n+m bits.

The advantages of the present reading device are the following.

Firstly, use of an analog/digital converter of n+m bits from the double conversion stage makes it possible to define a circuit architecture allowing use of both a single reading device 1 for the operations of reading and verify, and optimisation of the device 1 for the specific application.

Indeed, during the program verify, memory cell 2 is read using both the A/D conversion stages 10, 16, thus obtaining an output word of n+m bits, and high reading accuracy, whereas during stored data reading, only the first A/D conversion stage 10 is used, thus providing an output word of n bits. Therefore, even if stored data reading is less accurate than program verify, nevertheless firstly its accuracy is fully sufficient for these reading operations, and secondly, energy is saved by switching off selected stages (D/A conversion stage 12, second A/D conversion stage 16, and differentiator stage 14).

Finally, it is apparent that modifications and variants can be made to the reading device described and illustrated here, without departing from the scope of the present invention. For example, the reading device 1 can also comprise k analog/digital converter stages, wherein k>2, thus providing respective intermediate binary words of any length. Use of a plurality of converter stages in cascade, combined with the possibility of generating binary output words WT of any length, provides for a reading device having high application flexibility. Thus, the invention is to be limited only by the scope of the appended claims.

What is claimed is:

1. A reading device for a non-volatile memory cell having a threshold voltage, the reading device comprising an analog/digital converter configured to receive an input signal correlated to the memory cell threshold voltage, and to generate a binary output word, said analog/digital converter comprising at least two analog/digital conversion stages, a digital/analog conversion stage receiving an output from a first of the at least two analog/digital conversion stages, and a differentiator for stage receiving at a first signal input an input to the first of the at least two analog/digital conversion stages and further receiving at a second signal input an output from the digital/analog conversion stage and configured to be selectively enabled to output a difference signal correlated to the difference between the first and second signal inputs.

2. The reading device of claim 1 wherein said at least two analog/digital conversion stages comprise a first A/D conversion stage having an input receiving said input signal, and an output supplying a first intermediate binary word of n bits; the differentiator stage having the first and a second signal inputs connected respectively to said input of the first A/D conversion stage and to said output of said digital/analog conversion stage, and an output supplying the difference signal correlated to the difference between said input signal and an intermediate signal correlated to said first intermediate binary word; a second A/D conversion stage having a signal input receiving said difference signal, and an output supplying a second intermediate binary word of m bits; and a combining circuit having a first input and a second input connected to said outputs respectively of said first and second A/D conversion stages, and supplying at an output said binary output word of n+m bits.

3. The reading device of claim 1 wherein said differentiator stage, said second A/D conversion stage, and said D/A conversion stage each have an activation input receiving a common enabling signal.

4. The reading device of claim 2 wherein said combining circuit comprises an adder configured to receive at an input said first and second intermediate binary words, and supplying at an output said binary output word.

5. The reading device of claim 2, further comprising a memory circuit interposed between said output of said first A/D conversion stage and said first input of said combining circuit.

6. The reading device of claim 1 wherein said first and second intermediate binary words have the same length.

7. A memory cell reading circuit, comprising:
a first analog-to-digital converter configured to receive an analog memory cell signal and output a digital signal of n bits;
a differentiator circuit configured to receive a first analog signal corresponding to the digital signal of n bits and to receive the analog memory cell signal, the differentiator circuit further configured to be selectively enabled to output a second analog signal corresponding to the difference between the first analog signal and the analog memory cell signal;

a second analog-to-digital converter configured to receive the second analog signal and to output a digital signal of m bits; and a circuit for combining the data signal of n bits and the data signal of m bits into a data signal of n+m bits.

8. The circuit of claim 7, further comprising a digital-to-analog converter configured to receive the digital signal of n bits and output the first analog signal corresponding to the digital signal of n bits.

9. The circuit of claim 7 wherein the differentiator circuit further includes a control input for receiving a control signal to enable selective activation of the differentiator circuit.

10. The circuit of claim 7 wherein the circuit for combining the data signal of n bits and the data signal of m bits comprises an adder.

11. The circuit of claim 7, further comprising a latch circuit configured to receive the digital signal of n bits and to output the digital signal of n bits to the combining circuit after a predetermined period of time.

12. The circuit of claim 7 wherein the digital signal of n bits and the digital signal of m bits are of equal bit lengths.

13. A method for reading a nonvolatile memory cell, comprising:

converting an analog memory cell signal to a digital signal of n bits;

determining the difference between the analog memory cell signal and a first analog signal corresponding to the digital signal of n bits by selectively enabling a differentiation circuit for determining the difference between the analog memory cell signal and the first analog signal, and generating a second analog signal;

converting the second analog signal to a digital signal of m bits; and combining the digital signal of n bits and the digital signal of m bits to generate a digital binary output word of n+m bits.

14. The method of claim 13, further comprising, after converting the analog memory cell signal, converting the digital signal of n bits to the first analog signal.

15. The method of claim 13, further comprising, after converting the analog memory cell signal into a digital signal of n bits, storing the digital signal of n bits in a latch circuit for a predetermined period of time.

16. The method of claim 13 wherein the digital signal of n bits and the digital signal of m bits are generated to have equal bit lengths.

* * * * *

UNITED STATES PATENT AND TRADEMARK OFFICE
CERTIFICATE OF CORRECTION

PATENT NO. : 6,323,799 B1
DATED : November 27, 2001
INVENTOR(S) : Marco Pasotti et al.

Page 1 of 1

It is certified that error appears in the above-identified patent and that said Letters Patent is hereby corrected as shown below:

Column 4, claim 3,
Line 43, "device of claim 1" should read as -- device of claim 2 -- in the issued patent.

Signed and Sealed this

Twelfth Day of March, 2002

Attest:

Attesting Officer

JAMES E. ROGAN
Director of the United States Patent and Trademark Office